INVENTOR.
GERALD B. HERZOG
BY John V. Regan
ATTORNEY

INVENTOR.
GERALD B. HERZOG
BY John V. Regan
ATTORNEY

United States Patent Office 3,162,824
Patented Dec. 22, 1964

3,162,824

RESONATOR WITH INTERMEDIATE DIODE OSCILLATOR OR AMPLIFIER

Gerald Bernard Herzog, Princeton, N.J., assignor to Radio Corporation of America, a corporation of Delaware Filed July 27, 1960, Ser. No. 45,728
5 Claims. (Cl. 331—107)

This invention relates to parametric devices which are especially useful with parametric oscillators and amplifiers.

When a variable reactor is energized from a source, or pump, at a frequency $2f$, a negative conductance is established across the reactor at or near the subharmonic frequency $f$. When the reactor is connected in a low-loss circuit tuned to the frequency $f$, this negative conductance can overcome the circuit losses, whereupon the circuit oscillates parametrically at the subharmonic frequency $f$.

It has been suggested that a parametric circuit, oscillator or amplifier, comprise a quarter wave resonator at the frequency $f$, being shunted at one end by a voltage-sensitive, variable capacitance element, and being shorted at the other end. A device of this construction is capable of operating at the very high frequencies desired in modern carrier type systems. However, such a quarter wave resonator which is resonant at a frequency $f$ is also resonant at $3f$, $5f$ and other odd harmonics of $f$, but is not resonant at the even harmonics $2f$, $4f$, etc. Because the pump voltage appearing across the variable capacitance element determines the amount of energy developed at the subharmonic frequency, it is desirable that the parametric device be resonant both at the pump frequency $2f$ and at the subharmonic frequency $f$ so that maximum voltages can be developed across the variable capacitance element with only a small amount of pump power delivered to the device.

Briefly stated, an improved parametric device according to the invention includes the combination of a variable capacitance element connected between two sections of transmission line of predetermined lengths and in series therewith. The particular point at which the element is connected in the line to provide the desired double resonance, that is, the particular lengths of the two sections of transmission line, depends upon the capacity of the diode and the characteristic impedance of the transmission line. The resonator is electrically a quarter wave at the subharmonic frequency $f$ and three-quarters of a wavelength at the pump frequency $2f$.

In the accompanying drawing.

It has been proposed that a carrier system be used in a digital computer or the like operating at a very high speed. In a carrier system, the design of components is greatly simplified by the fact that, at a high carrier frequency, components with a comparatively small percentage bandwidth have a relatively high absolute bandwith.

In a carrier type system, a binary "1" may be represented by a radio frequency (RF) signal of a certain phase and frequency, and a binary "0" may be represented by an RF signal of opposite phase at the same frequency and amplitude. Such a scheme of binary information representation is commonly known as phase script notation. It has been suggested in article in the Proceedings of the IRE, August 1959, at pages 1317–1324, and in other publications, that parametric subharmonic oscillators can be used to switch, store, and amplify binary information coded in this manner. The theory of operation of parametric subharmonic oscillators and the desirable uses and characteristics thereof are set forth in the above-mentioned and other publications and will not be described here. Suffice it to say that a parametric subharmonic oscillator oscillates stably in either of two phases which are 180° apart at a frequency $f$ when energized, or pumped, at a frequency $2f$.

In order to fully utilize the high frequency capabilities of a carrier-type system, the parametric oscillator should be one comprising distributed constants, as opposed to lumped constant components. The very high frequency capabilities of transmission line components, such as resonators, are well known to those skilled in the art.

The above-mentioned article and other publications dealing with parametric subharmonic oscillators as high frequency components suggest that a suitable form of subharmonic oscillator is a quarter wave resonator shunted at one end by a variable capacity diode and being shorted at the opposite end. The resonator oscillates parametrically at a frequency $f$ when the variable capacity diode is "pumped" at a frequency $2f$. The amount of subharmonic energy developed is determined by the voltage developed across the diode at the pump frequency $2f$. In general, it has been found that such parametric oscillators have a very low efficiency because of the limited pump voltage that may be developed across the diode in such an arrangement. The advantages of the prsent invention in overcoming the above and other limitations of prior art parametric devices may best be understood from a brief description of resonators in general, and prior art resonators as parametric oscillators, in particular.

Figure 1:
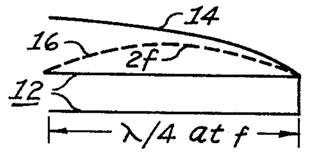
FIGURE 1 is a drawing of a close-ended quarter wave line resonant at a frequency $f$ and showing the standing waves of voltage at $f$ and $2f$.

There is illustrated in FIGURE 1 a quarter wave resonant line 12 shorted at the right-hand end, as viewed in the drawing. The transmission line 12 is resonant at the frequency $f$. The standing wave of voltage for the line at the frequency $f$ is illustrated by the solid curve 14 above the resonant line 12. The standing wave of current (not shown) at the frequency $f$ is displaced 90° from the standing wave 14 of voltage, and is maximum at the right, or shorted, end, and is minimum at the open, or left, end. The standing wave of voltage for a condition of resonance at a frequency $2f$ is illustrated by the dashed line 16. As may be seen in FIGURE 1, the voltage is a minimum at both ends of the line 12 at the frequency $2f$. The standing wave (not shown) of current for a condition of resonance at the frequency $2f$ is a maximum at each end of the line 12. Of course, maximum current cannot flow at the open, or left, end in the absence of a suitable connection thereto. The line 12 thus does not meet the conditions necessary for resonance at the frequency $2f$ in the absence of such a suitable connection.

It is well known that connecting a capacitor in shunt with the line 12 has the effect of electrically lengthening the line. It is then necessary to physically shorten the transmission line to bring the line back to resonance at the desired frequency. However, the amount of line electrically added at one frequency $f$ by the shunt capacitor is not the same as the amount of line electrically added at other frequencies, for example at $2f$. Therefore, when the transmission line is physically shortened to make the line resonant at $f$, the line will no longer be a half wavelength at the frequency $2f$. This is illustrated in FIGURE 2.

Figure 2:
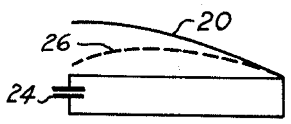
FIGURE 2 is a drawing of a quarter wave resonator closed at one end and shunted by a capacitor at the other end.

In FIGURE 2, the solid curve 20 represents the standing wave of voltage at the frequency $f$. The voltage is minimum, or zero, at the right, or shorted, end, and reaches a maximum at the left end which is shunted by the capacitor 24. The standing wave of voltage at a frequency $2f$ is illustrated by the dashed curve 26. The voltage at $2f$ is minimum, or zero, at the right or shorted end, and is low, but not zero, at the left end which is terminated by the shunt capacitor 24, for reasons explained above. Consequently, a small voltage at the frequency $2f$ may be developed across the capacitor 24. When the capacitor 24 is a voltage-sensitive, variable capacity diode having the desired characteristics, parametric oscillations at a frequency $f$ are sustained in the resonator when the voltage across the variable capacity diode is varied a sufficient amount at a frequency $2f$. The amount of energy developed at the subharmonic frequency $f$ is a function of the voltage developed across the diode 24 at the pump frequency $2f$. As may be seen in FIGURE 2, the pump voltage developed across the diode, as measured by the standing wave 26 at a point above the diode 24, has a low magnitude and, therefore, large amounts of pump power are required to provide a small amount of subharmonic energy.

A further limitation of the FIGURE 2 resonator, in addition to its low efficiency, is that the transmission line 12 of FIGURE 1 must be physically shortened in order to compensate for the effect of the shunt capacitor 24. At the very high frequencies desired, a quarter wavelength of transmission line is already very short. To physically shorten this line in order to compensate for the effects of the shunt capacitor 24, as in FIGURE 2, becomes impractical at very high frequencies because the length of the transmission line then becomes too short for practical purposes and may, in the extreme, cause the line to almost disappear. Further sections of transmission line may be added to avoid this difficulty. However, as is known, adding sections of transmission line has the effect of adding additional capacitance, and the bandwidth decreases as the capacitance increases, affecting the side bands, which is particularly undesirable in pulse operation. Obtainable rise time is also degraded by a large factor.

Figure 3:
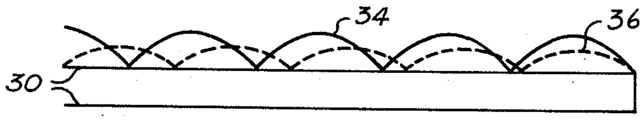
FIGURE 3 is a drawing of a long transmission line illustrating the effects of a shift in frequency on the resonance of the line.

A further disadvantage of adding additional sections of transmission line is illustrated in FIGURE 3. The transmission line 30 of FIGURE 3 is two and one-quarter wavelengths long at a frequency $f_1$. The standing wave of voltage at frequency $f_1$ is illustrated by the solid curve 34 above the line. A slightly higher frequency $f_2$ has a slightly shorter wavelength as may be seen from the dashed curve 36 of FIGURE 3. As may be seen in FIGURE 3, the difference is not very great in the first quarter wave section from the shorted, or right, end of the line 30. However, the displacement becomes cumulative throughout the various sections of the line 30 and amounts to a full quarter wave for the example given in FIGURE 3. The line 30 does not satisfy the conditions for resonance at $f_2$. The ideal resonator, therefore, is one which is only a quarter wavelength long electrically and in which a large voltage at the pump frequency $2f$ is developed across the variable capacitance element.

Figure 4:
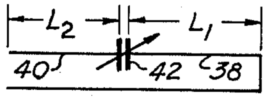
FIGURE 4 is a drawing of an improved quarter wave resonator according to the invention.

A resonator according to the invention that satisfies the desired conditions is one as illustrated schematically in FIGURE 4 and comprising a variable capacity element 42 connected in series with the line. The variable capacity element 42 is connected in series with two sections 38 and 40 of line having lengths $L_1$ and $L_2$, respectively.

Because a capacitive reactance connected in series with a transmission line produces a phase shift which is equivalent to a negative length of line, an electrical quarter wave resonator is physically longer with the series capacitor than without it. This is a real advantage at very high frequencies where a quarter wave line would otherwise become extremely short. The series capacitor physically lengthens the line an amount sufficient to make it feasible to use a quarter wave resonator at very high frequencies. If a shunt capacitor is used, as illustrated in FIGURE 2, the line must be shortened physically and eventually may disappear into the dimensions of the capacitor itself.

As stated heretofore, it is desirable to provide a resonator which is resonant not only at the subharmonic frequency $f$, but also the pump frequency $2f$. That the resonator of FIGURE 4 satisfies these conditions may be explained as follows. The amount by which a line is electrically shortened by a series capacitor is determined by the amount of capacitive reactance, and by the position at which this capacitance is added in the line. A further determining factor is the characteristic impedance of the line itself. Moreover, the amount by which the line is electrically shortened by the capacitance is different for different frequencies. By properly selecting the capacitor, the line impedance, and the position of the capacitor, it is possible to provide a resonator which is effectively a quarter wave at the subharmonic frequency $f$ and which is three-quarters of a wavelength at the pump frequency $2f$. Such a resonator, of course, is resonant at both of these frequencies.

Given the values of the capacitive reactance and the characteristic impedance, one may determine the lengths $L_1$ and $L_2$ of the sections 38 and 40 of transmission line of FIGURE 4 by a trial and error method or by using, for example, a Smith Chart. The lengths $L_1$ and $L_2$ also may be determined mathematically. A mathematical solution for $L_1$ and $L_2$ is given by the following transcendental equations, the derivation of which is omitted:

$$X=\frac{1}{\omega C Z_0} \qquad (1)$$

$$0.25=\frac{\text{arc}\ (\tan 360°\ L_1-X)}{360°}+L_2 \qquad (2)$$

$$0.75=\frac{\text{arc}\tan\left(\tan 720°\ L_1-\frac{X}{2}\right)}{360°}+2L_2 \qquad (3)$$

In the above equations, $L_1$ and $L_2$ are the lengths of the two sections expressed in number of wavelengths at the frequency $f$, and X is the capacitive reactance at the frequency $f$ normalized to the line impedance.

Figure 5:
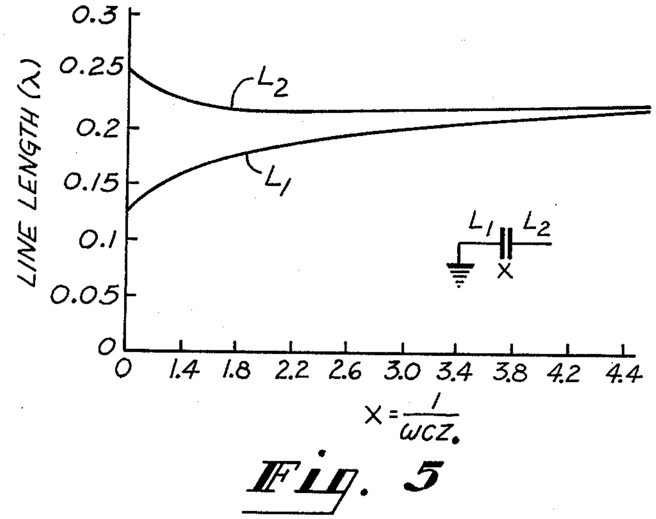
FIGURE 5 is a graph of line section length as a function of normalized capacitive reactance for a quarter wave resonator according to the invention.

Equations 2 and 3 above have been solved for various values of normalized capacitive reactance, and the results plotted in the graph of FIGURE 5. In FIGURE 5 the lengths $L_1$ and $L_2$ are expressed in wavelengths. Many different values of $L_1$ and $L_2$ provide double resonance for the same frequencies $f$ and $2f$ for different combinations of capacity and characteristic impedance. It is desirable, however, that the variable capacity element be placed in the line at a point where maximum pump current flows through the element, that is, where maximum pump voltage is developed across the element. It is possible to predict if a certain variable capacity element will function well in a parametric oscillator or amplifier at a given frequency through the use of the FIGURE 5 graph.

Figure 6:
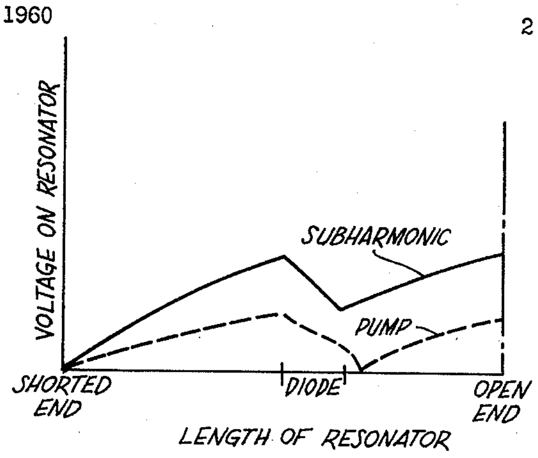
FIGURE 6 is a graph of voltage standing wave as a function of line length for the quarter wave resonator according to the invention.

FIGURE 6 is a graph wherein is plotted the standing waves of voltage along the length of the resonator of FIGURE 4 for the subharmonic frequency $f$ and pump frequency $2f$. In FIGURE 6, the voltage on the resonator is plotted along the ordinate and the length of the resonator, from the shorted end, is plotted along the abscissa. The resonator, as may be seen in FIGURE 6, is effectively a quarter wave at the subharmonic frequency $f$ and three-quarters of a wavelength at the pump frequency $2f$. The "jumps" in the curves of FIGURE 6 are a result of the voltage drop across the variable capacity element. The diode is preferably located, as shown, such that the voltage gradient across the diode at $2f$ is maximum, that is, where a large pump current at the frequency $2f$ flows through the diode.

Figure 7:
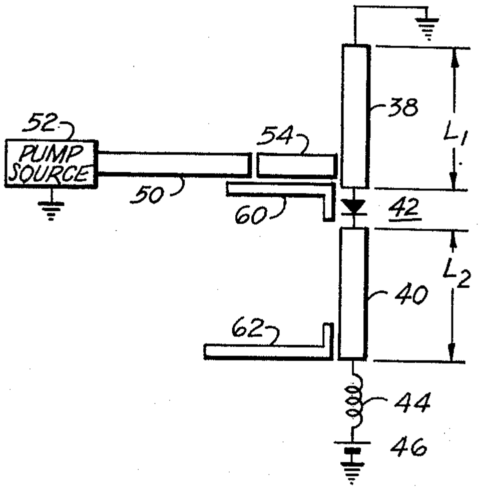
FIGURE 7 is a diagram, partially in plan view, of a parametric circuit according to the invention.

One embodiment of an improved parametric subharmonic oscillator arrangement employing a quarter wave resonator is illustrated in FIGURE 7. The parametric oscillator includes a variable capacity element 42, which may be a variable capacity diode as shown, connected between two sections 38, 40 of line. The line sections 38, 40 may be the center conductor of a coaxial line, the other, outer, conductor not being shown in the drawing.

Alternatively, the line sections 38, 40 may be portions of a strip transmission line of the type described in the article aforementioned. Such strip transmission lines may be constructed in known manner by employing a metal ground plate, which may be copper, applied as a backing on one side of a suitable dielectric material. On the other surface of the dielectric are strips of copper 38, 40 which may be established by printed circuit etching or plating techniques. A transmission line is formed between the strips 38, 40 and the spaced ground plate. The dielectric material and the spaced ground plate are not illustrated in FIGURE 7 in order to simplify the drawing. Reference may be had to the article aforementioned and other publications for further details of strip transmission lines if desired.

The upper end of the section 38 of line is connected to the outer conductor, in the case of a coaxial line, or to the metal ground plate, in the case of strip transmission line, by a non-inductive connection. The lower end of the line section 40 is connected by an RF choke 44 to the positive terminal of a D.C. biasing source, illustrated as a battery 46. The choke 44 may be, for example, a thin wire which has the characteristic of a high impedance choke to RF at high frequency. In any event, the transmission line is effectively open-circuited at the lower end of section 40 to RF frequencies. The choke 44, however, provides a low impedance D.C. path between the transmission line and the battery 46. The battery 46 furnishes the proper D.C. bias for the variable capacity diode 42, whereby maximum variation in capacitance may be obtained at the operating frequency.

Pump power at a frequency $2f$ is applied from a source 52 to a section 50 of transmission line and is coupled to the resonator by a section 54 of transmission line. These lines 50 and 54 also may be constructed of strip transmission line. The section 54 is effectively a half wavelength at the pump frequency $2f$ and functions as a filter to prevent the subharmonic energy of frequency $f$ from being coupled from the resonator to the pump source 52. The pump signal is coupled to the resonator at a point of high voltage at the frequency $2f$.

The pump source 52 may include, for example, a klystron, triode oscillator, or other suitable signal source of frequency $2f$. The pump source 52 may also include means for interrupting the flow of pump energy to the resonator or means for modulating the pump signal, depending upon the particular mode of operation desired. Such means are known and will not be described here. The value of battery 46 is selected in accordance with the mode of operation of the pump source 52.

Subharmonic energy at the frequency $f$ may be coupled to or from the resonator by antennas 60, 62, which may be of strip transmission line construction. The antennas preferably are positioned adjacent the resonator at locations where the voltage standing wave is high at the frequency $f$. As is known, when a parametric oscillator is energized initially from a pump, parametric oscillations may build up in one or another phase which are 180° apart. The particular phase is determined by conditions existing in the oscillator at that time. The parametric oscillations may be steered into a particular one of the two phases by applying to the oscillator a locking signal of small amplitude and frequency $f$ at the desired phase at a time slightly prior to, or coincident with, the pump signals. Such a locking signal may be coupled to the oscillator by way of either of the antennas 60, 62.

If the resonator of FIGURE 7 is one constructed of coaxial line, the antennas 60, 62 and the pump coupler 54 may be voltage probes positioned at high voltage points in the resonator. Current probes also may be used in place of the antennas, as will be apparent from a later description of FIGURE 8.

Figure 8:
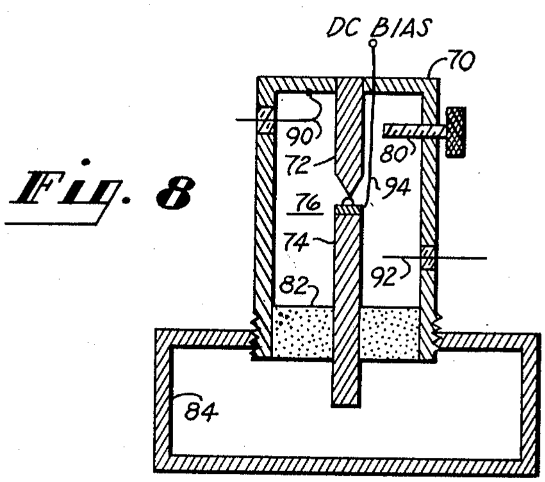
FIGURE 8 is a sectional view of a preferred form of parametric circuit according to the invention.

A preferred embodiment of a parametric device, oscillator or amplifier, is illustrated in cross-section in FIGURE 8, wherein the variable reactor is a variable capacity diode. Many of the commercially available variable capacity diodes are encapsulated by the manufacturers. The case and leads of the encapsulated device often add sufficient inductance and capacitance to upset the normal voltage patterns of a microwave structure. A preferred device in this event is one in which the diode encapsulation is a resonant structure. Such a structure is illustrated in FIGURE 8.

A cylindrical brass or silver case 70 serves as the outer conductor or shell of the quarter wave resonator. The inner conductor is formed in two sections 72, 74 separated by a variable capacity diode 76 and in electrical contact therewith. The upper end of the line section 72 is connected to the outer shell or conductor 70. The lengths of the line sections 72, 74 are such that, together with the capacitance of the variable capacity diode 76, double resonance at $f$ and $2f$ is provided in accordance with the teachings hereinabove. Also, the diode 76 is located at a point of high, preferably maximum, current at the pump frequency consistent with satisfying the condition of double resonance.

The resonator is designed for operation at a particular subharmonic frequency. The resonator may, however, be tuned over a narrow range by means of a screw 80 or other mechanism, such as a bellows movable in proximity to the center conductor. The latter means (not shown) has the advantage that an air tight structure is provided. The lower portion of the resonator is sealed by an insulating plug 82 which adds rigidity to the structure.

The resonator, as is illustrated, may be screwed into, or fitted otherwise into, a section 84 of waveguide. The lower portion of the line section 74 extends through the insulating plug 82 and into the waveguide 84. This projecting portion of the line section 74 is a suitable high voltage point for coupling the pump signal to the resonator. The pump signal then may be transmitted by the waveguide 84 from a pump source (not shown) to the resonator. This arrangement has the additional advantage that the waveguide 84 may be one selected to have a lower cutoff frequency lying between $f$ and $2f$. Such a waveguide transmits signals at the pump frequency $2f$ and rejects signals at the subharmonic frequency $f$, thereby obviating the necessity for a filter between the pump source and the resonator.

Locking signals at the subharmonic frequency $f$ may be brought into the resonator either by a current loop 90 or by a voltage probe 92. The subharmonic output from the resonator also may be brought out by these or similar loops or probes. The current loop is connected to the resonator at a point of high current, preferably at the shorted end. The voltage probe is inserted into the resonator at a point of high voltage at the frequency $f$, but low voltage at frequency $2f$ thus minimizing pump energy on the signal line. Several such loops and probes may be provided for multiple input-output connections.

D.C. bias for the diode 76 may be provided by connecting one end of a thin wire 94 to one terminal of the diode 76 and the other end of the wire 94 to one terminal of a D.C. biasing source, such as a battery (not shown).

As described heretofore, the wire 94 serves as an RF choke at the pump and subharmonic frequencies, and as a short to D.C. current.

Parametric oscillators constructed according to the invention and operating with a pump frequency of 10,000 megacycles had an efficiency as high as 170 times greater in magnitude than parametric oscillators constructed according to FIGURE 2, using the same variable capacity diodes. The devices of FIGURES 7 and 8, although described with particular reference to parametric subharmonic oscillators, also may be used as degenerate parametric amplifiers operating either in a non-oscillatory or in a super regenerative oscillatory mode. Such devices have been operated satisfactorily in experiments with a pump frequency of 8,000 megacycles.

What is claimed is:

1. The combination comprising: two sections of transmission line, one of said sections being shortened at one end, and an element of electrically variable capacitance connected between and in series with said sections, the lengths of said sections being such that, together with the capacitance of said element, said combination is electrically a quarter wavelength at a first frequency $f$ and three-quarters of a wavelength at a second frequency $2f$.

2. A quarter wave resonator for a parametric device comprising: two sections of transmission line having lengths $L_1$ and $L_2$, respectively, one of said sections being shortened at one end, a variable capacity diode connected between and in series with said two sections, said lengths $L_1$ and $L_2$ being such that, together with the capacitance of said diode, said resonator is a quarter wavelength at a first frequency $f$ and three-quarters of a wavelength at the second frequency $2f$.

3. A parametric device comprising: two sections of transmission line, one of said sections being shortened at one end, an electrically variable capacitance element connected between and in series with said sections, the lengths of said sections being such that, together with the capacitance of said element, said sections and said element are a quarter wave resonator at a frequency $f$ and a three-quarter wave resonator at a frequency $2f$, and means for energizing said resonator with signals having a frequency $2f$.

4. A resonator for a parametric device, said resonator being resonant both at a frequency $f$ and at frequency $2f$ comprising: a first section of transmission line shortened at one end and having a length of $L_1$ wavelengths at the frequency $f$, a second section of transmission line having a length of $L_2$ wavelengths at the frequency $f$, said first section and said second section each having a characteristic impedance $Z_0$, and an electrically variable capacitive element connected between and in series with said first section and said second section and having a nominal capacity C, wherein $L_1$ and $L_2$ are defined by the following equations:

$$0.25=\frac{\text{arc tan}\left(\tan 360^\circ L_1-\frac{1}{2\pi fCZ_0}\right)}{360^\circ}+L_2$$

$$0.75=\frac{\text{arc tan}\left(\tan 720^\circ L_1-\frac{1}{4\pi fCZ_0}\right)}{360^\circ}+2L_2$$

and means for pumping said resonator at a frequency $2f$.

5. A quarter wave resonator for a parametric device comprising, in combination, a first length and a second length of inner conductor, an electrically variable capacity element interposed between said first length and said second length and in contact therewith, and a concentric outer conductor joined physically at one end to the free end of said first length, said first and second length and the capacitance of said element being such that said resonator is electrically a quarter wavelength at a frequency $f$ and three-quarters of a wavelength at a frequency $2f$.

References Cited in the file of this patent

UNITED STATES PATENTS

| | | |
|---|---|---|
| 2,970,275 | Kurzrok | Jan. 31, 1961 |
| 3,012,204 | Dransfeld et al. | Dec. 5, 1961 |

OTHER REFERENCES

Harris: "CQ," November 1958, pp. 74–75, 159, 164, 168.

Weber: "Electronics," April 17, 1959, page 39.

Younger et al.: "Proceedings of the IRE," July 1959, pp. 1271–1272.

Jones: "QST," August 1959, pages 11–16, 138, and 140.

Jones: "CQ," August 1959, pages 30–35 and 123.

Sterzer: "Proceedings of the IRE," August 1959, pages 1317–1324.

Jones: "CQ," March 1960, pages 34–36 and 125.